United States Patent
Chiodini

(10) Patent No.: US 12,368,518 B2
(45) Date of Patent: Jul. 22, 2025

(54) METHOD FOR CHARACTERISING PROCESSING DIFFERENCES BETWEEN SEVERAL ANALOG CHANNELS

(71) Applicant: SAFRAN ELECTRONICS & DEFENSE, Paris (FR)

(72) Inventor: Alain Michel Chiodini, Moissy-Cramayel (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 428 days.

(21) Appl. No.: 17/952,888

(22) Filed: Sep. 26, 2022

(65) Prior Publication Data

US 2023/0096412 A1 Mar. 30, 2023

(30) Foreign Application Priority Data

Sep. 27, 2021 (FR) ...................................... 2110082

(51) Int. Cl.
*H04B 15/00* (2006.01)
(52) U.S. Cl.
CPC .................................... *H04B 15/00* (2013.01)
(58) Field of Classification Search
CPC ............ H04B 15/00; H04B 1/40; H04B 1/04
See application file for complete search history.

(56) References Cited

U.S. PATENT DOCUMENTS

| | | | | |
|---|---|---|---|---|
| 7,161,514 B2* | 1/2007 | Tamba | ................ | H03M 1/1038 |
| | | | | 341/120 |
| 11,496,148 B2* | 11/2022 | Mann | .................... | H03M 3/462 |

OTHER PUBLICATIONS

Anonymous, IEEE Standard for Digitizing Waveform Recorders, The Institute of Electrical and Electronics Engineers, Inc., 1994, pp. 1-74 (78 pages total).

(Continued)

*Primary Examiner* — Tuan H Nguyen
(74) *Attorney, Agent, or Firm* — Sughrue Mion, PLLC

(57) ABSTRACT

A method (100) for characterising processing differences between analog channels, the method comprising injecting (102) three analog signals into a first analog channel and a second analog channel, digitising (104) these signals so as to obtain digital signals $x_k$, $x_l$ and $y_l$ having N samples, estimating (106) parameters $\gamma_{k,l}$ and $\delta_{k,l}$ from the digital signals, where $\gamma_{k,l}$ is a ratio between an amplitude of the first analog signal at the output of the first analog channel and an amplitude of the second analog signal at the output of the second analog channel, and where $\delta_{k,l}$ is a difference between a phase shift induced by the first analog channel in the first analog signal and a phase shift induced by the second analog channel in the second analog signal, the estimation comprising the application of a least squares method in order to determine values of the parameters $\gamma_{k,l}$ and $\delta_{k,l}$ minimising the following quantity:

$$\sum_{n=1}^{N}(x_k(n) - \gamma_{k,l}(\cos(\delta_{k,l})x_l(n) - \sin(\delta_{k,l})y_l(n)))^2$$

10 Claims, 2 Drawing Sheets

(56) References Cited

OTHER PUBLICATIONS

French Preliminary Search Report for 2110082 dated, Aug. 19, 2022.

* cited by examiner

[Fig. 1]
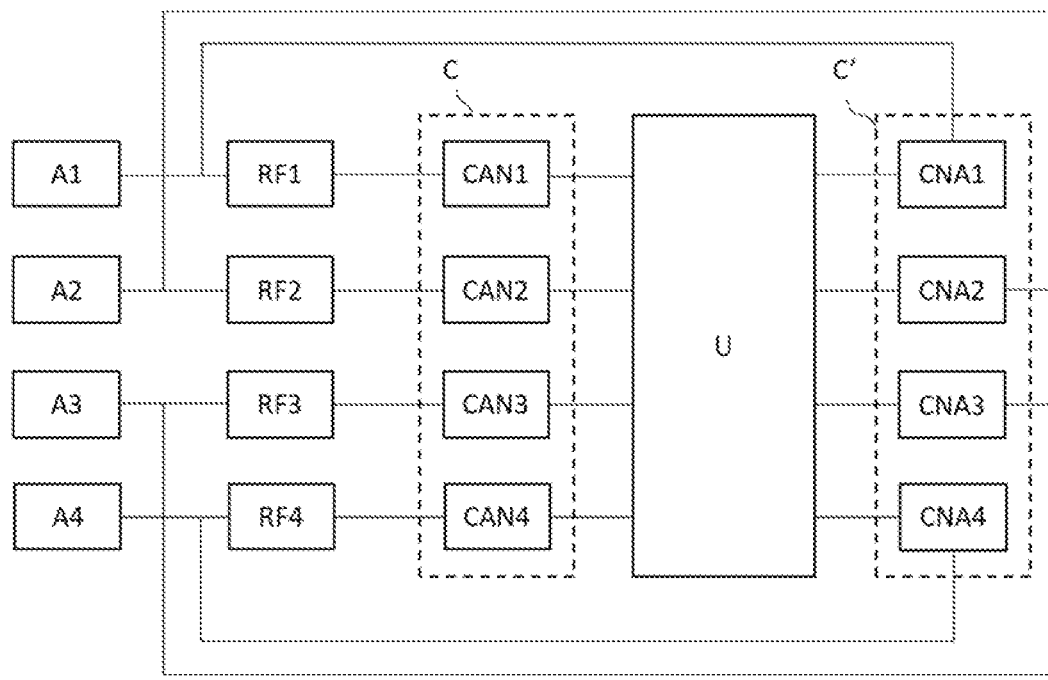
[Fig. 2]
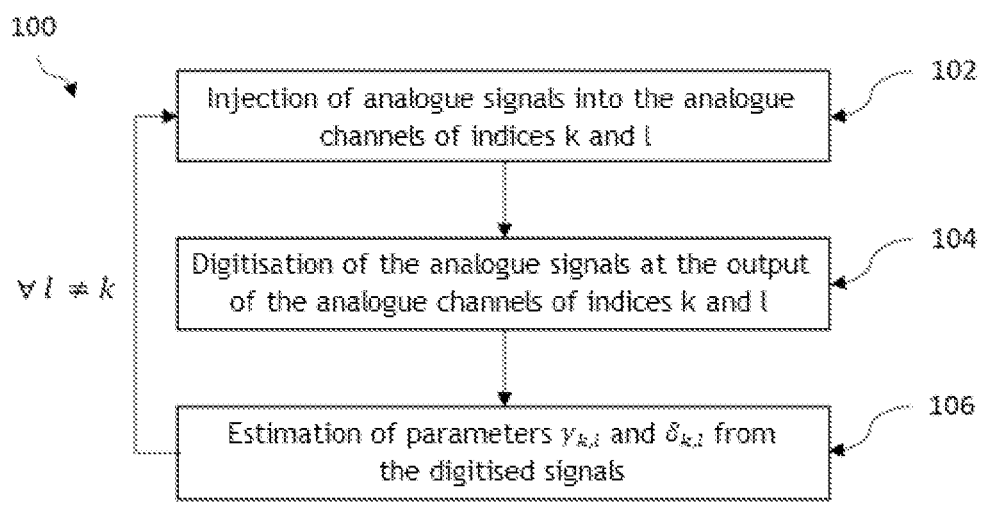

[Fig. 3]
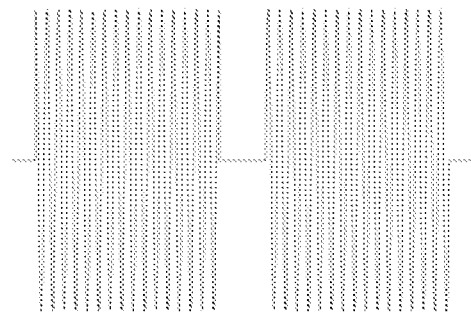
[Fig. 4]
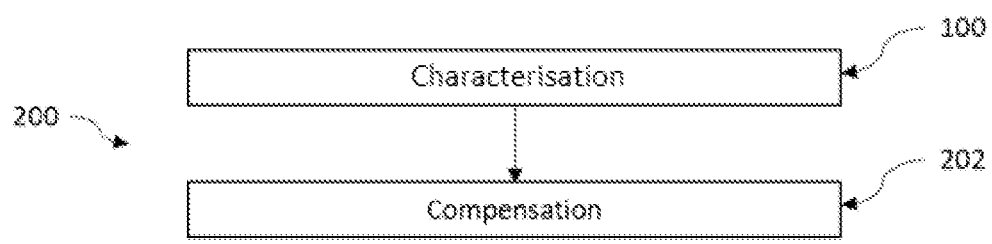

METHOD FOR CHARACTERISING PROCESSING DIFFERENCES BETWEEN SEVERAL ANALOG CHANNELS

FIELD OF THE INVENTION

The present invention relates to a method for characterising processing differences between several analog channels.

PRIOR ART

There are many systems comprising several analog channels arranged in parallel, and through which analog signals pass.

Such analog channels are often produced with the same electronic components, so as to each apply a processing operation that is supposed to be the same.

However, there may be residual differences between the processing operations carried out by different analog channels of such a system. In certain applications, these residual differences may give rise to errors downstream of the analog channels.

DISCLOSURE OF THE INVENTION

One aim of the invention is to characterise processing differences between several analog channels in a simple and effective manner.

This aim is achieved by a method for characterising processing differences between a first analog channel and a second analog channel, the method comprising steps of:
- injecting a first analog signal at the input of the first analog channel, a second analog signal at the input of the second analog channel, and a third signal at the input of the second analog channel, the first analog signal being a periodic signal, the second analog signal being a periodic signal of the same amplitude, the same period and the same waveform as the first analog signal, and the third analog signal being a periodic signal in phase quadrature with the second analog signal and of the same amplitude and the same period as the second analog signal,
- digitising the first analog signal at the output of the first analog channel, so as to obtain a first digital signal $x_k$ having N samples, digitising the second signal at the output of the second analog channel, so as to obtain a second digital signal $x_l$ having N samples, and digitising the third analog signal at the output of the second analog channel so as to obtain a third digital signal $y_l$ having N samples,
- estimating parameters $\gamma_{k,l}$ and $\delta_{k,l}$ from the first digital signal, the second digital signal and the third digital signal, where:
- $\gamma_{k,l}$ is a ratio between an amplitude of the first analog signal at the output of the first analog channel and an amplitude of the second analog signal at the output of the second analog channel,
- $\delta_{k,l}$ is a difference between a phase shift induced by the first analog channel in the first analog signal and a phase shift induced by the second analog channel in the second analog signal,
the estimation comprising the application of a least squares method in order to determine values of the parameters $\gamma_{k,l}$ and $\delta_{k,l}$ minimising the following quantity:

$$\sum_{n=1}^{N}(x_k(n) - \gamma_{k,l}(\cos(\delta_{k,l})x_l(n) - \sin(\delta_{k,l})y_l(n)))^2$$

in which
- $x_k(n)$ denotes the $n^{th}$ sample of the first digital signal,
- $x_l(n)$ denotes the $n^{th}$ sample of the second digital signal,
- $y_l(n)$ denotes the $n^{th}$ sample of the third digital signal.

The proposed method may also comprise the following optional features, taken individually or in combination wherever appropriate.

Preferably, the first analog signal is sinusoidal.

Preferably, the application of the least squares method comprises solving a system of equations based on the assumption that $\cos(\delta_{k,l}) \cong 1$ and/or that $\cos(2\delta_{k,l}) \cong 1$ and/or that $\sin(\delta_{k,l}) \cong \delta_{k,l}$ and/or that $\sin(2\delta_{k,l}) \cong 2\delta_{k,l}$.

Preferably, at least one of the first analog signal, the second analog signal and the third analog signal is derived from a digital signal generated by a digital circuit implementing the estimation of the parameters $\gamma_{k,l}$ and $\delta_{k,l}$.

Preferably, the third analog signal is injected at the input of the second analog channel after the second analog signal.

Also proposed is a method for compensating for processing differences between a first analog channel and a second analog channel, the method comprising steps of:
- characterising differences between a first analog channel and a second analog channel of an analog signal receiver, by implementing the method defined above,
- correcting a digital signal from the second analog channel based on the parameters $\gamma_{k,l}$ and $\delta_{k,l}$, so as to compensate for a phase difference and an amplitude difference induced by the second analog channel relative to the first analog channel.

The aim defined above is also achieved by a system comprising:
- a first analog channel suitable for receiving a first analog signal, the first signal being a periodic signal,
- a second analog channel suitable for receiving a second analog signal and a third analog signal, the second analog signal being a periodic signal of the same amplitude, the same period and the same waveform as the first analog signal, and the third analog signal being a periodic signal of the same amplitude and the same period as the second analog signal and in phase quadrature with the second analog signal,
- an analog-to-digital conversion stage suitable for: digitising the first analog signal at the output of the first analog channel, so as to obtain a first digital signal $x_k$ having N samples; digitising the second signal at the output of the second analog channel, so as to obtain a second digital signal $x_l$ having N samples; and digitising the third analog signal at the output of the second analog channel so as to obtain a third digital signal $y_l$ having N samples,
- a digital circuit configured to estimate parameters $\gamma_{k,l}$ and $\delta_{k,l}$ from the first digital signal, the second digital signal and the third digital signal, where $\gamma_{k,l}$ is a ratio between an amplitude of the first analog signal at the output of the first analog channel and an amplitude of the second analog signal at the output of the second analog channel, and where $\delta_{k,l}$ is a difference between a phase shift induced by the first analog channel in the first analog signal and a phase shift induced by the second analog channel in the second analog signal, the estimation implemented by the digital circuit U comprising the application of a least squares method in order to determine values of the parameters $\gamma_{k,l}$ and $\delta_{k,l}$ minimising the following quantity:

$$\sum_{n=1}^{N}(x_k(n) - \gamma_{k,l}(\cos(\delta_{k,l})x_l(n) - \sin(\delta_{k,l})y_l(n)))^2$$

where $x_k(n)$ denotes the $n^{th}$ sample of the first digital signal,
$x_l(n)$ denotes the $n^{th}$ sample of the second digital signal,
$y_l(n)$ denotes the $n^{th}$ sample of the third digital signal.

This system may also comprise the optional features of the characterisation method defined above.

In particular, this system may comprise a digital-to-analog conversion stage configured to generate at least one of the first analog signal, the second analog signal and the third analog signal, from a digital signal supplied by the digital circuit.

The digital-to-analog conversion stage may comprise a first digital-to-analog converter configured to generate the first analog signal, and a second digital-to-analog converter configured to generate the second analog signal and the third analog signal.

DESCRIPTION OF THE FIGURES

Other features, aims and advantages of the invention will become clearer from the description that follows, which is purely illustrative and non-limiting, and which should be read in reference to the appended drawings, in which:

FIG. 1 shows, schematically, a system comprising analog channels according to one embodiment.

FIG. 2 is a flowchart of steps of a characterisation method according to one embodiment of the invention.

FIG. 3 shows examples of signals injected during the implementation of the characterisation method of FIG. 2.

FIG. 4 is a flowchart of steps of a compensation method according to one embodiment of the invention.

Elements that are similar are denoted by identical reference signs in all the figures.

DETAILED DESCRIPTION OF THE INVENTION

1) Description of a System Comprising Analog Channels

FIG. 1 shows an example of a system comprising analog channels. This system is an analog signal receiver comprising a system of radio antennas A1-A4, a plurality of analog channels RF1-RF4, an analog-to-digital conversion stage C, and a digital circuit U.

The plurality of radio antennas comprises any number M of antennas, M being greater than or equal to 2, for example M=4 in the example shown in FIG. 1.

The plurality of analog channels is connected to the antenna system and to the analog-to-digital conversion stage.

Each analog channel RFi of index i comprises an input and an output. The input of each analog channel RFi of index i is connected to the radio antenna Ai also of index i. In other words, there are as many antennas as there are analog channels.

Each analog channel RFi typically comprises an RF front end arranged downstream of the radio antenna Ai associated with it. In a manner that is known per se, an RF front end may comprise the following components known to a person skilled in the art: a band-pass filter, an amplifier, a local oscillator, a mixer, etc.

In the embodiment of FIG. 1, the analog-to-digital conversion stage C comprises M analog-to-digital converters CAN1-CAN4, each converter CANi being connected to the output of an analog channel RFi specific to it. In other embodiments, the analog-to-digital conversion stage C could comprise a different number of converters CAN, for example a single one which would be connected to the respective outputs of all the analog-to-digital channels.

The analog-to-digital converters CAN1-CAN4 are configured to digitise analog signals at a sampling rate $F_S$.

The digital circuit U is arranged at the output of the analog-to-digital conversion stage C, so as to be able to process digital signals that have been digitised by the analog-to-digital conversion stage C.

The digital circuit U is, for example, or is part of, a system-on-chip.

The system also comprises a digital-to-analog conversion stage C'. The digital-to-analog conversion stage C' is arranged at the output of the digital circuit U, and is moreover connected to the respective inputs of the analog channels RF1-RF4. Therefore, it is possible to inject, into the analog channels, analog signals generated by the stage C' from digital signals generated by the digital circuit U.

In the embodiment of FIG. 1, the digital-to-analog conversion stage C' comprises M digital-to-analog converters CNA1-CNA4, each converter CNAi being connected to the input of an analog channel RFi specific to it. Therefore, a converter CNAi allows an analog signal to be injected into the analog channel RFi only. In other embodiments, the digital-to-analog conversion stage C' could comprise a different number of converters CNA, for example a single one which would be connected to the respective inputs of all the analog-to-digital channels.

The conversion stages C and C' may be part of the same system-on-chip as the digital circuit U.

2) Method for Characterising Processing Differences Between Analog Channels

In reference to FIG. 2, a method 100 for characterising processing differences between an analog channel of index k (RFk) and an analog channel of index l (RFl) of the system set out above comprises the following steps.

In an injection step 102, three analog signals described below are injected.

It is assumed that any functions modifying internal signals that may be included in the analog channels of indices k and l are deactivated during the injection step 102, so that the analog channels behave like simple transmission lines. Therefore, if the channels of indices k and l were perfect, the same signals would be found at the output of these channels as at the input.

In step 102, a first analog signal is injected at the input of the analog channel of index k. The first analog signal is a periodic signal, characterised by an amplitude, a signal waveform, and a period (i.e., the duration of an elementary periodic pattern of the signal).

For example, the first analog signal is produced by the digital-to-analog conversion stage C', based on a digital signal supplied by the digital circuit U.

The first analog signal propagates in the analog channel of index k, from its input to its output. During this propagation, the analog channel of index k alters the first analog signal; the analog channel is in particular likely to modify, in a residual manner, the amplitude and the phase of the first analog signal passing through it.

In addition, a second analog signal is injected at the input of the analog channel of index l. The second analog signal is identical to the first analog signal: it has the same amplitude, the same period and the same waveform as the first analog signal.

For example, the second analog signal is produced by the digital-to-analog conversion stage C', based on a digital signal supplied by the digital circuit U.

The second analog signal propagates in the analog channel of index l, from its input to its output. During this propagation, the analog channel of index l alters the second analog signal; the analog channel of index l is therefore likely to modify, in a residual manner, the amplitude and the phase of the second analog signal passing through it. However, the alteration caused by the second analog channel may be different from the alteration caused by the first analog channel. It is this processing difference that the method 100 aims to characterise.

Moreover, a third analog signal is injected at the input of the analog channel of index l. The third analog signal is a periodic signal of the same amplitude and the same period as the second analog signal. However, the third analog signal is in quadrature with the second signal. This means that the third signal differs from the second signal only by a phase shift of 90° in relation thereto (all other things being equal).

For example, the third analog signal is produced by the digital-to-analog conversion stage C', based on a digital signal supplied by the digital circuit U.

The third analog signal propagates in the analog channel of index l, from its input to its output. During this propagation, the analog channel of index l alters the third analog signal; the analog channel of index l is therefore likely to modify, in a residual manner, the amplitude and the phase of the third analog signal passing through it, in the same proportions as the second analog signal.

In a digitisation step 104, the analog signals are digitised by the analog-to-digital conversion stage in order to obtain digital signals:

The first analog signal is digitised by the CAN of index k, so as to produce a first digital signal $x_k$ comprising N samples. The $n^{th}$ sample of the digital signal $x_k$ produced in this way is denoted $x_k(n)$.

The second analog signal is digitised by the CAN of index l, so as to produce a second digital signal $x_l$ comprising N samples. The $n^{th}$ sample of the digital signal $x_l$ produced in this way is denoted $x_l(n)$.

The third analog signal is then digitised by the CAN of index l, so as to produce a third digital signal $y_l$ comprising N samples. The $n^{th}$ sample of the digital signal $y_l$ produced in this way is denoted $y_l(n)$.

The injections of the first analog signal, the second analog signal and the third analog signal can be implemented in any order, and the same applies to obtaining the digital signals $x_k$, $x_l$ and $y_l$ by digitisation.

In particular, the injection of the second signal may be implemented before, during or after the injection of the first signal. It is in particular possible to route these two signals simultaneously to the analog channels of respective indices k and l; as a variant, these two signals may be injected one after another. In particular, the three analog signals may be injected sequentially.

Furthermore, although the digitisation step 104 is shown taking place after step 102 on the flowchart of FIG. 2, it is naturally possible to consider interleaving these two steps (for example, the first analog signal is injected and digitised, then the second signal is injected and digitised, then the third analog signal is injected and digitised).

In an estimation step 106, the digital circuit U estimates two parameters $\gamma_{k,l}$ and $\delta_{k,l}$ indicative of differences between the analog channels of indices k and l, from the digital signals $x_k$, $x_l$ and $y_l$ obtained in the digitisation step 104.

On the one hand, the parameter $\gamma_{k,l}$ is a ratio between an amplitude of the first analog signal at the output of the first analog channel and an amplitude of the second analog signal at the output of the second analog channel.

On the other hand, the parameter $\delta_{k,l}$ is a difference between a phase shift induced by the first analog channel in the first analog signal and a phase shift induced by the second analog channel in the second analog signal.

The estimation carried out in step 106 applies the least squares method in order to determine values of the parameters $\gamma_{k,l}$ and $\delta_{k,l}$ minimising the following quantity $\mathcal{C}_{k,l}$, constituted by a sum of squared residuals:

$$C_{k,l} = \sum_{n=1}^{N}(x_k(n) - \gamma_{k,l}(\cos(\delta_{k,l})x_l(n) - \sin(\delta_{k,l})y_l(n)))^2$$

Here, the least squares method is applied by considering as a residual a difference between the first digital signal $x_k$ (left-hand term of the residual) and a model of this first signal (right-hand term of the residual). Notably, this model depends on the two parameters to be estimated $\gamma_{k,l}$ and $\delta_{k,l}$, and on the digital signals $x_l$ and $y_l$.

The values of the parameters $\gamma_{k,l}$ and $\delta_{k,l}$ which minimise the sum of residuals $\mathcal{C}_{k,l}$ may typically be obtained by the digital circuit U by solving the following system of equations:

$$\begin{cases} \dfrac{\partial C_{k,l}}{\partial \gamma_{k,l}} = 0 \\ \dfrac{\partial C_{k,l}}{\partial \delta_{k,l}} = 0 \end{cases}$$

The parameters $\gamma_{k,l}$ and $\delta_{k,l}$ estimated in step 106 characterise differences of the analog channel of index l relative to the analog channel of index k.

The partial derivatives of the quantity $\mathcal{C}_{k,l}$ to be minimised are rewritten as follows:

$$\frac{\partial C_{k,l}}{\partial \gamma_{k,l}} = 2\gamma_{k,l}\left((\cos(\delta_{k,l}))^2 S_{x_l^2} + (\sin(\delta_{k,l}))^2 S_{y_l^2} - \sin(2\delta_{k,l})S_{x_l y_l}\right) +$$
$$2\left(-\cos(\delta_{k,l})S_{x_k x_l} + \sin(\delta_{k,l})S_{x_k y_l}\right)$$

$$\frac{\partial C_{k,l}}{\partial \delta_{k,l}} = 2\gamma_{k,l}\left(-\gamma_{k,l}\left(\frac{1}{2}\sin(2\delta_{k,l})\left(S_{x_l^2} - S_{y_l^2}\right) + \cos(2\delta_{k,l})S_{x_l y_l}\right) +\right.$$
$$\left.\sin(\delta_{k,l})S_{x_k x_l} + \cos(\delta_{k,l})S_{x_k y_l}\right)$$

In which:

$$S_{x_l^2} = \sum_{n=1}^{N}(x_l(n))^2$$

$$S_{y_l^2} = \sum_{n=1}^{N}(y_l(n))^2$$

$$S_{x_l y_l} = \sum_{n=1}^{N}x_l(n)y_l(n)$$

-continued $$S_{x_k x_l} = \sum_{n=1}^{N} x_k(n) x_l(n)$$

$$S_{x_k y_l} = \sum_{n=1}^{N} x_k(n) y_l(n)$$

Ultimately, the values of $\gamma_{k,l}$ and $\delta_{k,l}$ are obtained by solving the following system of equations, in this embodiment:

$$\begin{cases} \gamma_{k,l}\left((\cos(\delta_{k,l}))^2 S_{x_l^2} + (\sin(\delta_{k,l}))^2 S_{y_l^2} - \sin(2\delta_{k,l}) S_{x_l y_l}\right) + \left(-\cos(\delta_{k,l}) S_{x_k x_l} + \sin(\delta_{k,l}) S_{x_k y_l}\right) = 0 \\ -\gamma_{k,l}\left(\frac{1}{2}\sin(2\delta_{k,l})\left(S_{x_l^2} - S_{y_l^2}\right) + \cos(2\delta_{k,l}) S_{x_l y_l}\right) + \sin(\delta_{k,l}) S_{x_k x_l} + \cos(\delta_{k,l}) S_{x_k y_l} = 0 \end{cases}$$

This simplified system of equations may be solved with a reasonable computational load, for example by applying the Newton-Raphson method, which is known to a person skilled in the art.

The parameters $\gamma_{k,l}$ and $\delta_{k,l}$ are stored in a memory, for example in a memory integrated in the digital circuit U.

The above steps can be applied several times M−1 for different pairs of channels (k, l), varying l in such a way as to cover any channel other than the channel of index k. For example, if k=1 is chosen, these steps are implemented for the following pairs of analog channels: (1, 2), (1, 3), ... , (1, M). Naturally, it is then not necessary to reinject the first analog signal several times.

2.1) Use of Sinusoidal Analog Signals

An embodiment of the method 100 which is advantageous as a result of its simplicity will now be described. In this embodiment, the first injected analog signal is a sinusoidal signal.

If the first sinusoidal analog signal were digitised without alteration at the sampling rate $F_S$, the first analog signal would be written as follows:

$$x_0(n) = A \cos(\omega n + \varphi)$$

In which:

$$\omega = 2\pi v = 2\pi \frac{f}{F_S}$$

where A denotes the amplitude, v the reduced frequency, φ the initial phase and f the frequency of the first analog signal.

In order to simplify the disclosure of the method, φ=0 is chosen, as is conventional (which has no effect on the method itself).

The first digital signal $x_k$, which results from the first analog signal passing through the analog channel of index k and its subsequent digitisation, can then be modelled as follows:

$$x_k(n) = \rho_k \cos(\omega n + \theta_k), n = 1 \ldots N$$

where $\theta_k$ denotes the phase difference induced by the first analog signal passing through the analog channel of index k, and $\rho_k$ denotes an amplitude of the first analog signal at the output of the analog channel of index k.

It should further be noted, by way of a reminder, that the second analog signal is identical to the first analog signal. In these conditions, the second digital signal $x_l$, which results from the second analog signal passing through the analog channel of index l and its subsequent digitisation, can be modelled as follows:

$$x_l(n) = \rho_l \cos(\omega n + \theta_l), n = 1 \ldots N$$

where $\theta_l$ denotes the phase difference induced by the second analog signal passing through the analog channel of index l and $\rho_l$ denotes the amplitude of the second analog signal at the output of the analog channel of index l.

Finally, by way of a reminder, the third analog signal is in quadrature with the second analog signal; the third analog signal is therefore also sinusoidal. FIG. 3 shows an embodiment of the second analog signal and the third analog signal, when they are sinusoidal and are injected one after the other into the analog channel of index l.

If the third analog signal were digitised without alteration at the sampling rate $F_S$, the third analog signal would be written as follows:

$$y_0(n) = A \sin(\omega n)$$

In these conditions, the third digital signal $y_l$, which results from the third analog signal passing through the analog channel of index l and its subsequent digitisation, can be modelled as follows:

$$y_l(n) = \rho_l \sin(\omega n + \theta_l), n = N+K \ldots 2N+K-1$$

where K denotes a time difference separating the third digital signal from the second digital signal in time.

The digital circuit U can easily align the third digital signal $y_l$ with the second digital signal $x_l$, so as to obtain:

$$x_l(n) = \rho_l \cos(\omega n + \theta_l), n = 1 \ldots N$$

$$y_l(n) = \rho_l \sin(\omega n + \theta_l), n = 1 \ldots N$$

In this embodiment, the two parameters $\gamma_{k,l}$ and $\delta_{k,l}$ that the digital circuit U estimates in step 106 can be written as follows:

$$\delta_{k,l} = \theta_k - \theta_l$$

$$\gamma_{k,l} = \frac{\rho_k}{\rho_l}$$

2.2) Possible Approximations

In particularly advantageous embodiments, the digital circuit U is configured to solve the system of equations above by making certain approximations.

A first approximation consists in making the assumption that $\cos(\delta_{k,l}) \cong 1$. This approximation can be seen as a limited expansion (LE) of order zero of the cosine function at zero (or of order 1, since there is no "$\delta_{k,l}$" term in this LE).

A second approximation, similar to the first, consists in making the assumption that $\cos(2\delta_{k,l}) \cong 1$.

A third approximation consists in making the assumption that $\sin(\delta_{k,l}) \cong \delta_{k,l}$. This second approximation can be seen as a limited expansion (LE) of order one of the cosine function at zero.

A fourth approximation, similar to the third approximation, consists in making the assumption that $\sin(2\delta_{k,l}) \cong 2\delta_{k,l}$.

Each of these four approximations is particularly advantageous when the parameter $\delta_{k,l}$ is close to zero, which is a reasonable assumption. They both help simplify the solving, by the digital circuit U, of the system of equations set out above.

The digital circuit can apply any combination of approximations from these four approximations, and may in particular apply all four.

When the four approximations mentioned above are applied, the system of equations to be solved is simplified as follows:

$$\begin{cases} \gamma_{k,l}\left(S_{x_l^2} - 2\delta_{k,l}S_{x_l y_l}\right) + \left(-S_{x_k x_l} + \delta_{k,l}S_{x_k y_l}\right) = 0 \\ -\gamma_{k,l}\left(\delta_{k,l}\left(S_{x_l^2} - S_{y_l^2}\right) + S_{x_l y_l}\right) + \delta_{k,l}S_{x_k x_l} + S_{x_k y_l} = 0 \end{cases}$$

It should be noted that, unlike the general case disclosed above in section 2.2), this system of equations can be solved formally, which is particularly advantageous.

2.3) Use of Other Types of Periodic Signals

The method 100 can be extended to other periodic analog signals. Indeed, any periodic analog signal can be written as a Fourier series, i.e., as a weighted sum of cosine/sine functions.

3) Method for Compensating for Processing Differences Between Analog Channels

A method 200 for compensating for processing differences between analog channels of the system comprises the following steps.

This method 200 comprises implementing the characterisation method 100 described above, so as to obtain at least one pair of parameters $\gamma_{k,l}$ and $\delta_{k,l}$ associated with the pair of analog channels of indices k and l.

Let us now suppose that a radio signal is received by the antenna connected to the analog channel of index k, and by the antenna connected to the analog channel of index l.

This radio signal passes through the analog channel of index k before being digitised into a digital signal referred to, as is conventional, as the reference digital signal.

This radio signal also passes through the analog channel of index l before being digitised into a digital signal referred to, as is conventional, as the digital signal to be corrected of index l.

In a compensation step 202, the digital circuit U corrects the digital signal to be corrected of index l to be compensated based on the parameters $\gamma_{k,l}$ and $\delta_{k,l}$, so as to compensate for the phase difference and an amplitude difference induced by the second analog channel relative to the first analog channel. This compensation thus "erases" the processing differences between the channels of indices k and l, by taking the channel of index k as the reference.

This compensation typically consists in multiplying the signal to be corrected of index l by the scalar $\gamma_{k,l}e^{i\delta_{k,l}}$, when this signal is in baseband.

The above compensation step 202 can be implemented for any l other than k, i.e., for any channel other than the channel of index k taken as the reference.

The invention claimed is:

1. A method comprising:
   injecting a first analog signal in a first analog channel, a second analog signal in a second analog channel, and a third analog signal in the second analog channel, wherein the first analog signal, the second analog signal and the third analog signal are periodic and have a same amplitude and a same period, wherein the first analog signal and the second analog signal have a same waveform, wherein the third analog signal is in phase quadrature with the second analog signal,
   digitizing the first analog signal in output of the first analog channel, so as to obtain a first digital signal $x_k$ having N samples, digitizing the second analog signal in output of the second analog channel, so as to obtain a second digital signal $x_l$ having N samples, and digitising the third analog signal in output of the second analog channel so as to obtain a third digital signal $y_l$ having N samples,
   estimating parameters $\gamma_{k,l}$ and $\delta_{k,l}$ from the first digital signal, the second digital signal and the third digital signal,
   wherein:
   $\gamma_{k,l}$ is a ratio between an amplitude of the first analog signal in output of the first analog channel and an amplitude of the second analog signal in output of the second analog channel,
   $\delta_{k,l}$ is a difference between a phase shift induced by the first analog channel in the first analog signal and a phase shift induced by the second analog channel in the second analog signal,
   wherein estimating the parameters $\gamma_{k,l}$ and $\delta_{k,l}$ comprises applying a least squares method in order to determine values of the parameters $\gamma_{k,l}$ and $\delta_{k,l}$ that minimize the following quantity:

$$\sum_{n=1}^{N}(x_k(n) - \gamma_{k,l}(\cos(\delta_{k,l})x_l(n) - \sin(\delta_{k,l})y_l(n)))^2,$$

and
   wherein:
   $x_k(n)$ is a $n^{th}$ sample of the first digital signal,
   $x_l(n)$ is a $n^{th}$ sample of the second digital signal, and
   $y_l(n)$ is a $n^{th}$ sample of the third digital signal.

2. The method according to claim 1, wherein the first analog signal is sinusoidal.

3. The method according to claim 1, wherein applying the least squares method comprises solving a system of equations assuming that $\cos(\delta_{k,l}) \cong \delta_{k,l}$ or that $\cos(2\delta_{k,l}) \cong 1$.

4. The method according to claim 1, wherein applying the least squares method comprises solving a system of equations assuming that $\sin(\delta_{k,l}) \cong \delta_{k,l}$ and/or that $\sin(2\delta_{k,l}) \cong 2\delta_{k,l}$.

5. The method according to claim 1, wherein at least one of the first analog signal, the second analog signal and the third analog signal is derived from a digital signal generated by a digital circuit, wherein estimating the parameters $\gamma_{k,l}$ and $\delta_{k,l}$ is carried out by the digital circuit.

6. The method according to claim 1, wherein the third analog signal is injected in the second analog channel after the second analog signal.

7. The method according to claim 1, further comprising:
   correcting a digital signal coming from the second analog channel based on the parameters $\gamma_{k,l}$ and $\delta_{k,l}$, so as to compensate for a phase difference and an amplitude difference induced by the second analog channel relative to the first analog channel.

8. A system comprising:
   a first analog channel for receiving a first analog signal, the first analog signal being periodic,
   a second analog channel for receiving a second analog signal and a third analog signal, wherein the second analog signal and the third analog signal are periodic, wherein the first analog signal, the second analog signal and the third analog signal have a same amplitude and a same period, wherein the first analog signal and the second analog signal have a same waveform, and wherein the third analog signal is in phase quadrature with the second analog signal, an analog-to-digital conversion stage for: digitizing the first analog signal in output of the first analog channel, so as to obtain a first digital signal $x_k$ having N samples; digitizing the second analog signal in output of the second analog channel, so as to obtain a second digital signal $x_l$ having N samples; and digitizing the third analog signal in output of the second analog channel so as to obtain a third digital signal $y_l$ having N samples, and a digital circuit configured to estimate parameters $\gamma_{k,l}$ and $\delta_{k,l}$ from the first digital signal, the second digital signal and the third digital signal, where $\gamma_{k,l}$ is a ratio between an amplitude of the first analog signal in output of the first analog channel and an amplitude of the second analog signal in output of the second analog channel, and where $\delta_{k,l}$ is a difference between a phase shift induced by the first analog channel in the first analog signal and a phase shift induced by the second analog channel in the second analog signal, wherein estimating the parameters $\gamma_{k,l}$ and $\delta_{k,l}$ comprises applying a least squares method in order to determine values of the parameters $\gamma_{k,l}$ and $\delta_{k,l}$ minimizing the following quantity:

$$\sum_{n=1}^{N}(x_k(n)-\gamma_{k,l}(\cos(\delta_{k,l})x_l(n)-\sin(\delta_{k,l})y_l(n)))^2$$

where:
$x_k(n)$ is the $n^{th}$ sample of the first digital signal,
$x_l(n)$ is the $n^{th}$ sample of the second digital signal, and
$y_l(n)$ is the $n^{th}$ sample of the third digital signal.

9. The system according to claim 8, comprising a digital-to-analog conversion stage configured to generate at least one of the first analog signal, the second analog signal and the third analog signal, from a digital signal supplied by the digital circuit.

10. The system according to claim 9, wherein the digital-to-analog conversion stage comprises a first digital-to-analog converter configured to generate the first analog signal, and a second digital-to-analog converter configured to generate the second analog signal and the third analog signal.

* * * * *